United States Patent
Hatem et al.

(10) Patent No.: US 9,576,819 B2
(45) Date of Patent: Feb. 21, 2017

(54) TECHNIQUES FOR INCREASED DOPANT ACTIVATION IN COMPOUND SEMICONDUCTORS

(71) Applicant: Varian Semiconductor Equipment Associates, Inc., Gloucester, MA (US)

(72) Inventors: Christopher R. Hatem, Billerica, MA (US); Benjamin Colombeau, Salem, MA (US); Kevin Jones, Gloucester, MA (US); Aaron Lind, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/741,784

(22) Filed: Jun. 17, 2015

(65) Prior Publication Data

US 2015/0364325 A1     Dec. 17, 2015

Related U.S. Application Data

(60) Provisional application No. 62/013,199, filed on Jun. 17, 2014.

(51) Int. Cl.
*H01L 21/265*     (2006.01)
*H01L 21/324*     (2006.01)

(52) U.S. Cl.
CPC ..... *H01L 21/3245* (2013.01); *H01L 21/26546* (2013.01)

(58) Field of Classification Search
CPC .......................... H01L 21/2258; H01L 21/3245
See application file for complete search history.

(56) References Cited

U.S. PATENT DOCUMENTS

| 4,494,995 A | * | 1/1985 | Tabatabaie-Alavi | H01L 21/26546 257/609 |
|---|---|---|---|---|
| 4,615,766 A | * | 10/1986 | Jackson | H01L 21/314 148/DIG. 84 |
| 5,294,557 A | * | 3/1994 | Moore | H01L 21/26546 148/DIG. 56 |

* cited by examiner

*Primary Examiner* — Bradley K Smith

(57) ABSTRACT

A method of doping a compound semiconductor substrate includes: setting a first substrate temperature for the compound semiconductor substrate in a first temperature range; implanting a dopant species into the compound semiconductor substrate at a first ion dose at the first substrate temperature; and annealing the compound semiconductor substrate after the implanting the ions. In conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range.

15 Claims, 3 Drawing Sheets

| NO DEFECTS OBSERVED | NO DEFECTS OBSERVED | DEFECTS OBSERVED ~25-75 nm BELOW UPPER SURFACE | DEFECTS OBSERVED ~25-75 nm BELOW UPPER SURFACE | DEFECTS OBSERVED ~25-75 nm BELOW UPPER SURFACE |
|---|---|---|---|---|
| FIG. 3A | FIG. 3B | FIG. 3C | FIG. 3D | FIG. 3E |

TECHNIQUES FOR INCREASED DOPANT ACTIVATION IN COMPOUND SEMICONDUCTORS

RELATED APPLICATIONS

This application claims priority to U.S. Provisional Patent Application 62/013,199, filed Jun. 17, 2014 and incorporated by reference herein its entirety.

FIELD

The present embodiments relate to compound semiconductor doping, and more particularly to ion implantation techniques for activation of dopants in compound semiconductors.

BACKGROUND

As semiconductor devices such as logic and memory devices continue to scale to smaller dimensions, the use of conventional processing and materials to fabricate semiconductor devices is increasingly problematic. In some cases conventional polysilicon/silicon oxide gates used to build field effect transistors (FETs) are being replaced with metal gates and a high dielectric constant gate oxide. The source/drain and/or channel regions of a transistor may be changed to accommodate the performance targets for very small transistors.

$In_{0.53}Ga_{0.47}As$ is a promising alternative material to silicon for fabricating n-type FET (n-FET) devices because of the very high room temperature electron mobility of $In_{0.53}Ga_{0.47}As$, reported to exceed $10^4$ $cm^2$/V-s. Little work has been undertaken to optimize the ohmic contacts to this material, a factor in determining overall device performance, especially as device size shrinks. As device size continues to shrink, the total series resistance has an increasingly negative effect on the FET drive current, where the series resistance can be mitigated by minimizing the resistance of the contacts to the source/drain regions. The contact resistivity of $\sim 5 \times 10\text{-}8 \Omega$ $cm^2$ or lower has been shown as a threshold to meet the electrical targets of NFETs at the 5 nm technology node using compound semiconductor n-type devices. This range of contact resistivity in turn entails concentrations of active dopants of $\sim 5 \times 10^{19}/cm^3$ or greater. To date such high concentrations have not been accomplished using ion implantation. The use of in-situ doping during growth of a semiconductor film has resulted in better levels of activation, while low film quality and unintentional doping remain challenges to this approach. In view of the above, satisfactory approaches to fabricating highly doped compound semiconductors are lacking. With respect to these and other considerations the present improvements are provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method of doping a compound semiconductor substrate includes: setting a first substrate temperature for the compound semiconductor substrate in a first temperature range; implanting a dopant species into the compound semiconductor substrate at a first ion dose at the first substrate temperature; and annealing the compound semiconductor substrate after the implanting the ions, wherein in conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range.

In a further embodiment, a method of controlling implant damage in a compound semiconductor substrate may include implanting a first ion dose of a dopant species at a first substrate temperature, wherein the first ion dose and first substrate temperature are interoperative to induce dechanneling of the dopant species during implantation while not amorphizing a crystalline lattice of the compound semiconductor substrate; and after the implanting, annealing the compound semiconductor substrate at an annealing temperature and annealing duration effective to activate the dopant species.

In another embodiment, a method of increasing dopant activation in a $In_xGa_{1-x}As$ substrate may include setting a first substrate temperature for the $In_xGa_{1-x}As$ substrate in a first temperature range, implanting a dopant species into the compound $In_xGa_{1-x}As$ substrate at a first ion dose at the first substrate temperature; and annealing the $In_xGa_{1-x}As$ substrate substrate after the implanting the ions, wherein, in conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range, wherein the first temperature range is above room temperature and below 140° C.

BRIEF DESCRIPTION OF THE DRAWINGS

FIGS. 3A-3E depict a summary of results of cross-sectional transmission electron microscopy measurements of samples prepared in accordance with the present embodiments.

DETAILED DESCRIPTION

Figure 1:
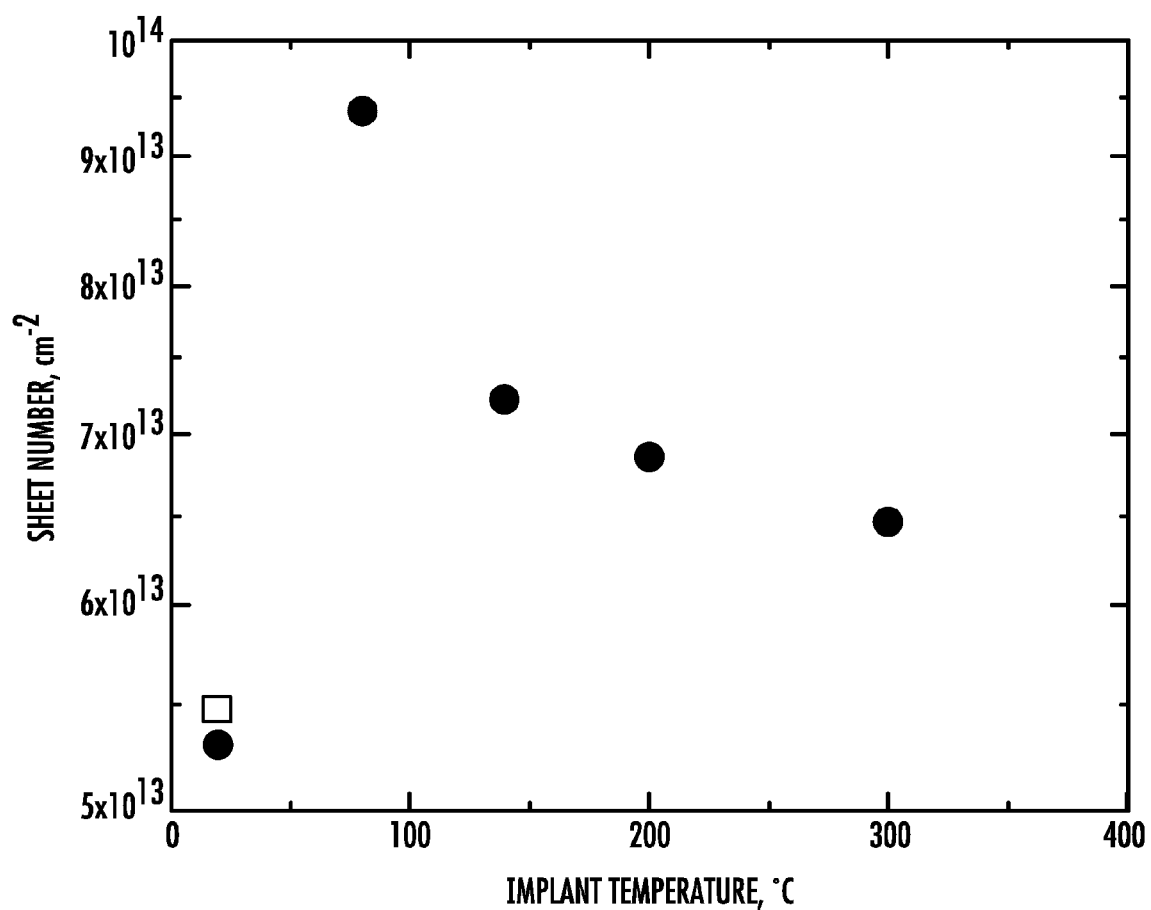
FIG. 1 depicts results of carrier concentration measurements of samples prepared in accordance with the present embodiments.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In the present embodiments, the present inventors have identified a process window to enhance dopant activation in compound semiconductors. In particular embodiments a process window for III-V compound semiconductors based upon elements selected from group III and group V of the periodic table has been successfully demonstrated. The present embodiments involve ion implantation into a compound semiconductor substrate at an ion dose and ion energy and substrate temperature effective to create a high fraction of vacancies in the compound semiconductor while not amorphizing the compound semiconductor material during the implant. Unlike conventional "hot" ion implantation into silicon based semiconductor substrates employed, for example, at temperatures of 300° C. or higher, substrate temperatures for ion implantation in accordance with embodiments of this disclosure may be significantly lower, for example, in some cases less than 100° C. Contrary to expectations based upon prior ion implantation work, this "warm" ion implantation may result in device properties superior to the properties achieved by hot ion implantation.

By way of background, hot ion implantation has been shown in to significantly reduce the amount of implant damage and post-anneal leakage paths in silicon finFET devices. Additionally, in silicon substrate implantation, the general rule has been observed where the higher the substrate temperature employed the better the resulting crystal quality of implanted silicon. Accordingly, in some cases fabricating silicon based FET devices using a high temperature ion implantation where the substrate is maintained at temperatures of 300° C., 400° C., or higher during ion implantation may be advantageous.

As detailed below, the techniques of the present embodiments are related to an ion implantation process window for establishing enhanced dopant activation in compound semiconductor substrates, such as $In_xGa_{1-x}As$. As discussed further below, and without limitation, the process window identified by the present inventors is believed to reflect an optimum balance of different mechanisms related to the favoring or disfavoring of vacancies within the compound semiconductor lattice, where the lattice may host a dopant species such as silicon.

In some embodiments, $In_xGa_{1-x}As$ having a composition where x=0.53 has been subject to implantation using silicon as the implant species. As noted $In_xGa_{1-x}As$ and in particular $In_{0.53}Ga_{0.47}As$ is a material capable may achieve very high room temperature electron mobility, reported to exceed $10^4$ $cm^2/V$-s. When silicon ion implantation is performed into $In_xGa_{1-x}As$ substrate on under certain conditions, the implanted silicon species act as donors, resulting in formation of an n-type doping of the implanted region. In some embodiments the ion dose may be at a level from $1E14/cm^2$ to $5E15/cm^2$. In some embodiments where the dopant species is silicon, the ion energy for implanting silicon ions vary be from 200 eV to 30 keV. In various embodiments, post-implantation annealing may be performed at a temperature ranging from 400° C. to 1000° C. for a duration of 1 ns to 60 sec. In one series of experiments silicon ions were implanted into $In_{0.53}Ga_{0.47}As$ substrates at a dose of $6E14/cm^2$ and ion energy of 5-20 keV while the $In_{0.53}Ga_{0.47}As$ substrates were set at a series of different substrate temperatures during implantation.

In the present embodiments, ion implantation into a compound semiconductor substrate may be performed using a beamline ion implanter, plasma immersion implanter or other ion implantation apparatus capable of generating ion energies for introducing dopants into a compound semiconductor substrate over a target depth range. In various embodiments, the configuration of a beamline implanter may be an implanter as known in the art suitable for medium or low energy ion implantation, where ion energy may be less than 500 keV. The embodiments are not limited in this context.

In particular embodiments, substrates may be heated during exposure to ions using a heater coupled to a substrate stage. The heater may be a radiative heat source, resistive heat source, or other heater. Such a heater may in particular embodiments be configured to heat a substrate during implantations to temperatures in the range of room temperature (20° C.) to 500° C. The embodiments are not limited in this context. During ion implantation, to establish the target substrate temperature, a substrate stage may be heated by a heater to a target temperature, and may be subject to closed loop heater control including a temperature sensor and feedback control. In some variants a substrate stage may be cooled by active coolant acting in concert with a heater to establish a target substrate temperature.

FIG. 1 depicts the results of sheet carrier concentration measurements made upon a series of $In_{0.53}Ga_{0.47}As$ substrates after silicon implantation using a beamline ion implanter. Before sheet carrier concentration measurement, the substrates were subjected to post-implantation annealing at 750° C. for 5 seconds. The sheet carrier concentration results are shown as a function of substrate temperatures during implantation. The term "substrate temperature," as used herein, denotes substrate temperature during ion implantation unless otherwise noted. As illustrated, the ion implantation was carried out over a substrate temperature range between room temperature (20° C.) and 300° C. The range of substrate temperatures above room temperature investigated covers a substrate temperature regime not generally employed for hot ion implantation as discussed above. The sheet carrier concentration results (in units of carriers per $cm^2$) are directly related to the volume concentration of active n-type dopants in the substrate measured, in this case, providing a measure of active silicon dopants.

Because the implantation conditions are otherwise the same except for variation is substrate temperature, to a first approximation the concentration of silicon implanted species may be assumed to be comparable in the different measured samples. Accordingly, the sheet carrier concentration values provide a direct indication of the degree of activation of silicon atoms as n-type dopants within the $In_{0.53}Ga_{0.47}As$ substrate.

While room temperature ion implantation of silicon has been previously used to dope $In_{0.53}Ga_{0.47}As$ substrates, the results of FIG. 1 show such an implant process does not provide excellent dopant activation. After room temperature silicon ion implantation and post-implantation annealing two different measurements conducted on the annealed samples indicate a sheet carrier concentration of $\sim 5.4 \times 10^{13}/cm^2$ is achieved. When ion implantation is performed with the substrate set at 300° C., the sheet carrier concentration increases to $\sim 6.5 \times 10^{13}/cm^2$. When a series of measurements were conducted after heating substrates to intermediate temperatures closer to room temperature, the results indicate the sheet carrier concentration (dopant activation) does not monotonically increase with substrate temperature. As the substrate temperature during ion implantation is increased between 20° C. and 300° C., at moderately above room temperature, a much larger enhancement in sheet carrier concentration is found. As shown in FIG. 1, at 80° C., a sharp increase in sheet carrier concentration to $9.5 \times 10^{13}/cm^2$ is observed. At substrate temperatures of 140° C. and above, a rapid decrease in sheet carrier concentration with respect to the sheet carrier concentration observed at 80° C. takes place as a function of increased substrate temperature. Accordingly, for ion implantation of silicon into $In_{0.53}Ga_{0.47}As$, a narrow substrate temperature range representing a peak in carrier activation as a function of substrate temperature has been identified by the present inventors. This substrate temperature range is centered at substrate temperatures below 100° C. for the specific silicon ion energy, ion dose, and ion dose rate indicated above. The identification of this substrate temperature range has resulted in generation of the highest implantation activation values for the $In_{0.53}Ga_{0.47}As$ for implantation temperature of 80° C.

The occurrence of a peak in sheet carrier concentration in this substrate temperature range, representing a process window for achieving higher activation in $In_{0.53}Ga_{0.47}As$, is believed to be due to a contribution from different factors. For one, the activation of silicon in $In_{0.53}Ga_{0.47}As$ is dependent upon the generation of vacancies on the group III sties (In, Ga) within host lattice. The number of vacancies on group III sites may in general increase with increased ion implantation dose, creating lattice damage including vacancies. Increasing substrate temperature increases diffusion rates generally, including dopant diffusion, thereby tending to increase the ability of dopant atoms to diffuse to activation sites. Because silicon is relatively immobile in $In_{0.53}Ga_{0.47}As$ increases in substrate temperature may be ineffective in increasing activation of implanted silicon. Moreover, the use of increased substrate temperature during ion implantation may result in dynamic annealing of implant damage as the implant damage is being created, thereby resulting in a steady state generation of fewer vacancies to provide activation sites for implanted dopant species. Maintaining the substrate temperature at too low a value may result in too much residual lattice damage after ion implantation for a given ion dose, since the substrate temperature may be insufficient to restore any of the damage created during the implantation. In some cases ion dose adequate to generate a sufficient concentration of dopant species may result in amorphization if substrate temperature is too low. While the amorphized layer of the $In_{0.53}Ga_{0.47}As$ may recrystallize after post-implantation annealing is performed, and may generate activation of some of the dopant species, the implanted dopants may not benefit from the presence of a high concentration of vacancies to facilitate activation, since the region containing the dopant species as-implanted is amorphous. In view of the contributions from the above mechanisms, the substrate temperature range where dopant activation is peaked is believed to represent a regime where implant damage to the $In_{0.53}Ga_{0.47}As$ crystalline lattice is maximized while not amorphizing the lattice. Therefore, the as-implanted semiconductor substrate provides a maximum number of vacancies to host dopant atoms, facilitating maximum activation upon post-implantation annealing.

Figure 2:
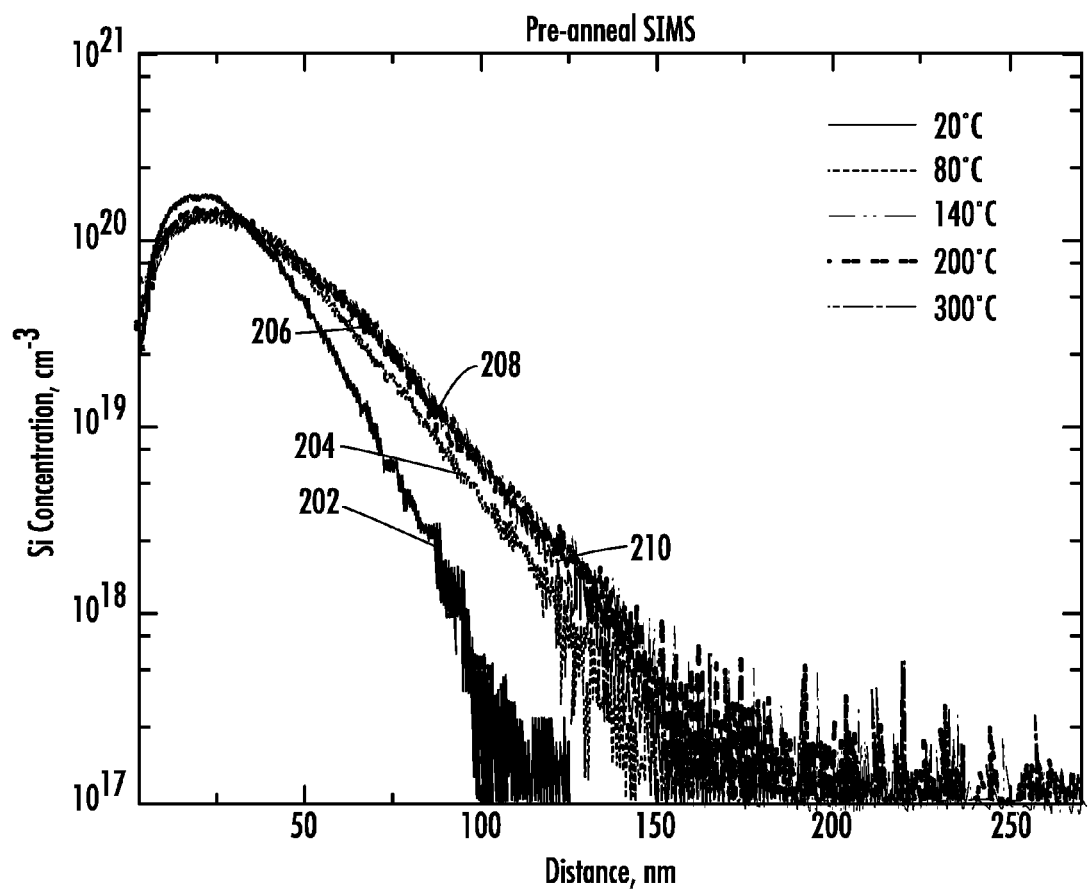
FIG. 2 depicts results of secondary ion mass spectrometry measurements of samples prepared in accordance with the present embodiments.

FIG. 2 depicts the results of secondary ion mass spectrometry (SIMS) measurements of $In_{0.53}Ga_{0.47}As$ substrates as a function of implantation temperature for silicon implantation performed at an ion dose of $6E14/cm^2$ and an ion energy of 20 keV. The SIMS data represents concentration of silicon species as a function of depth after ion implantation and before post-implantation annealing. A series of curves 202, 204, 206, 208, and 210 reflect dopant concentration as a function of depth for implantation at room temperature, 80° C., 140° C., 200° C., and 300° C., respectively. Thus, the SIMS data reflects the depth distribution of silicon in as-implanted samples resulting from the different processes affecting silicon movement during implantation. As illustrated, the sample implanted at 20° C. (curve 202) exhibits the shallowest distribution of silicon species, where the silicon concentration profile is more peaked towards the substrate surface (0 nm) and more rapidly falls to below $10^{18}/cm^3$ at approximately 100 nm depth. This is distinct from the other silicon concentration profiles (curves 204-210) taken from samples implanted at substrate temperatures of 80° C. to 300° C., corresponding to the set of same samples where the sheet carrier concentration data is shown in FIG. 1. For the samples implanted at 80° C. to 300° C., the silicon concentration profiles are not as peaked, broader, and do not reach $10^{18}/cm^3$ concentration until depths of at approximately 125 nm or greater.

The SIMS silicon concentration profile observed for the sample implanted at 20° C. can be explained as the result of dynamic amorphization of the substrate where silicon species are being implanted. This entails the creation of sufficient lattice damage to amorphize portions of the substrate as silicon is being implanted, such that, as silicon species continue to implant the amorphizing or amorphized $In_{0.53}Ga_{0.47}As$ material causes dechanneling of dopant ions. The dechanneling denotes the condition where crystalline lattice channels are degraded or destroyed. This reduces the ability for incident ions whose incident trajectories are aligned parallel to the channels to travel along such channels to reach greater implantation depths before coming to rest. Accordingly, the distinctly shallower and more peaked silicon concentration profile at 20° C. is a hallmark of an ion implantation process where dechanneling is present, presumably because of amorphization during implantation. At higher implantation temperatures where dynamic annealing is sufficient to preserve crystallinity of the $In_{0.53}Ga_{0.47}As$ material, channels within the lattice are preserved, thereby facilitating deeper penetration by a fraction of the dopant species, as shown.

Notably, in the SIMS data of FIG. 2, the silicon concentration profile for 80° C. (curve 304) implantation temperature is slightly shallower than at temperatures of 140° C. or above. This is repeatedly observed for samples implanted in this temperature range and is believed to reflect the circumstance where channeling is beginning to lessen for implantation at 80° C. due to increased ion damage not dynamically annealed away, and may be reflected in the degradation of such lattice channels. Put another way, this slight dechanneling observed at 80° C. represents the condition of a lattice of $In_{0.53}Ga_{0.47}As$ material having maximum level or close-to-maximum level of vacancies and other lattice damage present. Above the maximum level of damage the lattice may become amorphous and remain amorphous during ion implantation. Accordingly, the substrate temperature window provided by the present embodiments where dopant activation is maximized, may be considered to represent the regime where lattice damage is maximized to a threshold below the regime of amorphization. The vacancy creation associated with the lattice damage provides the non-diffusing implanted silicon dopant species with substitutional sites in their immediate vicinity, so silicon dopants can occupy these electron donor sites of the $In_{0.53}Ga_{0.47}As$ while long range diffusion does not take place.

FIG. 3A to FIG. 3E illustrate present a summary of results of cross-sectional morphology at the nanometer level for $In_{0.53}Ga_{0.47}As$ samples after post-implantation annealing. The FIGS. 3A-3E show results based upon cross-sectional transmission electron microscopy of substrates implanted at the same set of temperatures where sheet carrier concentration data and SIMs data are shown in respective FIGS. 1 and 2. As shown in FIGS. 3A and 3B, after post-implantation annealing extended defects are not visibly present in samples implanted at 20° C. and 80° C., respectively. Samples implanted at 140° C., 200° C., and 300° C. show visible post-implant defects clustered in a range ~25 nm to 75 nm below the surface of the substrate. Thus, while the surface region of the sample implanted at 80° C. remains crystalline after ion implantation, the post-annealing microstructure is more consistent with the amorphized sample implanted at 20° C. than with the crystalline samples implanted at higher temperatures. Thus, samples implanted within the implantation temperature process window of the present embodiments exhibit higher dopant activation, as well as less residual damage after post-implant annealing. This latter quality may help preserve carrier mobility resulting in overall lower resistivity.

The process window for achieving enhanced dopant activation may vary according to implantation ion energy and ion dose, as well as substrate material. For example, in the $In_xGa_{1-x}As$ system, the temperature range for achieving peak activation for implanted silicon may vary with "x." Similarly, the temperature range for achieving peak activation in other compound semiconductor systems may vary from the results shown herein. In addition, as ion energy is changed, the distribution of vacancies within a substrate caused by the implantation of dopant species may change, leading to a shift in the substrate temperature for maintaining the substrate microstructure below the amorphization threshold. The same applies to the effect of changes in dopant species. For example if Ge is used as an n-type dopant in a III-IV compound semiconductor system, such as $In_{0.53}Ga_{0.47}As$ or GaN, the substrate temperature range for implantation of Ge to achieve highest activation may vary from the substrate temperature range shown by the results of FIGS. 1-3.

Figure 4:
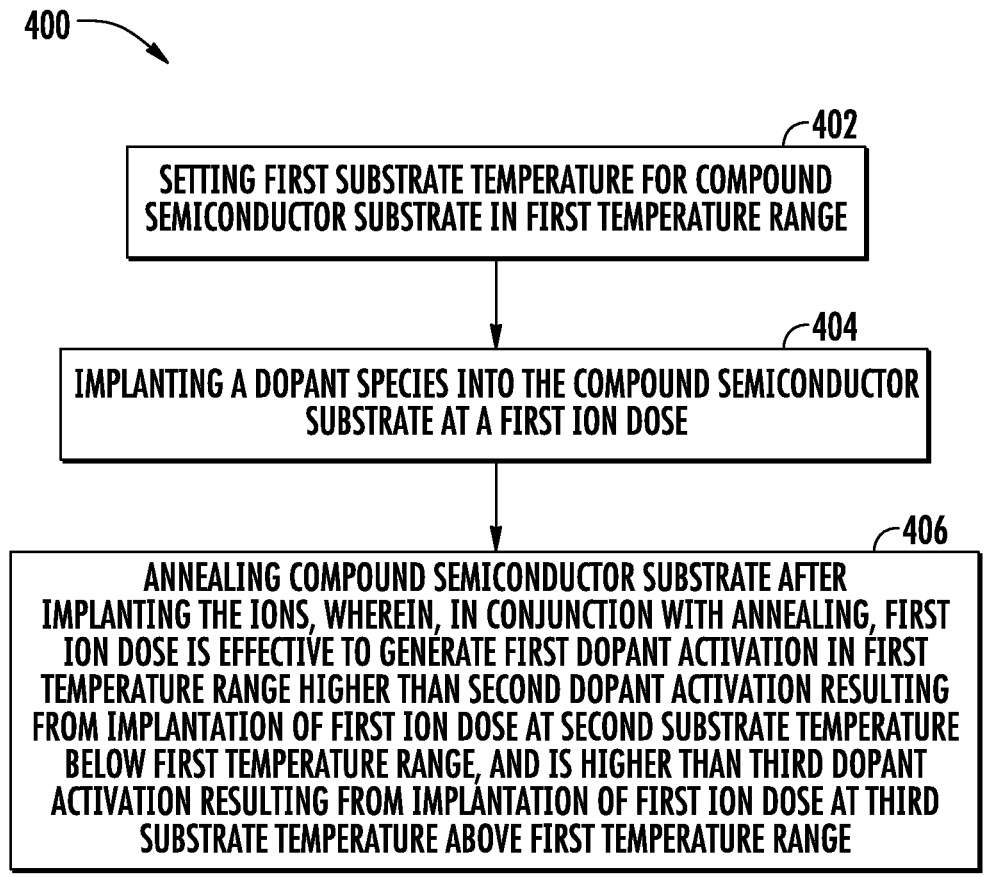
FIG. 4 depicts an exemplary process flow according to embodiments of the disclosure.

FIG. 4 depicts an exemplary process flow 400 according to embodiments of the disclosure. At block 402 a first substrate temperature is set for the compound semiconductor substrate in a first temperature range. At block 404 implanting a dopant species into the compound semiconductor substrate at a first ion dose takes place at the first substrate temperature. At block 406 the compound semiconductor substrate is annealed after the implanting the ions, wherein, in conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range.

Moreover, while the above results have detailed a system for n-type doping of a compound semiconductor, the present embodiments also cover p-type doping, where the implantation temperature and other implantation parameters are set to increase the vacancy creation while not amorphizing the compound semiconductor. In a given system, comprising a dopant species, compound semiconductor material, and choice of ion energy/ion dose/ion dose rate, a process window for increasing dopant activation may be readily determined by establishing a baseline condition where substrate amorphization takes place for a target dose of an implanted species at a given substrate temperature. The substrate temperature may then be adjusted upwardly to the point where the as-implanted substrate is no longer amorphous.

The present embodiments provide the advantage of technique to increase dopant activation while not amorphizing a material being implanted by implanting a compound semiconductor substrate at a temperature range within a process window of temperature. The present embodiments also provide the further advantage of increasing dopant concentration in a compound semiconductor while avoiding recrystallization processes associated with amorphized material, where dopant activation may be lower due to the loss of vacancy sites to host dopant atoms in amorphous material.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth and spirit of the present disclosure as described herein.

What is claimed is:

1. A method of doping a compound semiconductor substrate, wherein the compound semiconductor is $In_xGa_{1-x}As$, comprising:
   setting a first substrate temperature for the compound semiconductor substrate in a first temperature range, wherein the first temperature range is between 50° C. and 100° C.;
   implanting a dopant species into the compound semiconductor substrate at a first ion dose at the first substrate temperature; and
   annealing the compound semiconductor substrate after the implanting the ions, wherein, in conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range.

2. The method of claim 1, wherein the dopant species is silicon.

3. The method of claim 1, wherein x is equal to 0.53.

4. The method of claim 1, wherein the ion energy is from 200 eV to 30 keV and the dopant species is silicon.

5. The method of claim 1, wherein the first ion dose is from $1E14/cm^2$ to $5E15/cm^2$.

6. The method of claim 1, wherein the implanting the dopant species comprises implanting ions of the dopant at an ion energy and ion dose to generate dechanneling of ions during the implanting of the dopant species at the first substrate temperature while not amorphizing the compound semiconductor.

7. The method of claim 1, wherein the annealing the compound semiconductor comprises performing annealing at a temperature in the range of 400° C. to 1000° C. for a duration of 1 ns to 60 sec.

8. A method of controlling implant damage in a compound semiconductor substrate, comprising:
   implanting a first ion dose of a dopant species at a first substrate temperature, wherein the first temperature is between 50° C. and 100° C., wherein the first ion dose and first substrate temperature are interoperative to induce dechanneling of the dopant species during implantation while not amorphizing a crystalline lattice of the compound semiconductor substrate; and after the implanting, annealing the compound semiconductor substrate at an annealing temperature and annealing duration effective to activate the dopant species, wherein the compound semiconductor is $In_xGa_{1-x}$, and wherein x is equal to 0.53.

9. The method of claim 8, wherein, in conjunction with the annealing, the first ion dose is effective to generate a first dopant activation at the first substrate temperature higher than a second dopant activation resulting from implantation of the first ion dose at a second substrate temperature below the first substrate temperature, and is higher than a third dopant activation resulting from implantation of the first ion dose at a third substrate temperature above the first substrate temperature.

10. The method of claim 8, wherein the dopant species is silicon.

11. The method of claim 8, wherein the annealing the compound semiconductor comprises performing annealing at a temperature ranging from 400° C. to 1000° C. for a duration of 1 ns to 60 sec.

12. A method of increasing dopant activation in a $In_xGa_{1-x}$ As substrate, comprising:

setting a first substrate temperature for the $In_xGa_{1-x}$ As substrate in a first temperature range;

implanting silicon into the compound $In_xGa_{1-x}$ As substrate at a first ion dose at the first substrate temperature; and annealing the $In_xGa_{1-x}$ As substrate substrate after the implanting the ions, wherein, in conjunction with the annealing, the first ion dose is effective to generate a first dopant activation in the first temperature range higher than a second dopant activation resulting from implantation of the first ion dose at a second substrate temperature below the first temperature range, and is higher than a third dopant activation resulting from implantation of the first ion dose at a third substrate temperature above the first temperature range, wherein the first temperature range is between 50° C. and 140° C.

13. The method of claim 12, wherein x=0.53, and the first substrate temperature is between 50° C. and 100° C.

14. The method of claim 13, wherein the annealing comprises annealing the $In_xGa_{1-x}$ As substrate at a temperature of 750° C. for five seconds.

15. The method of claim 14, wherein the first ion dose is from $1E14/cm^2$ to $5E15/cm^2$.

* * * * *